(12) United States Patent
White

(10) Patent No.: US 8,686,710 B1
(45) Date of Patent: Apr. 1, 2014

(54) ELECTROMAGNETIC WAVE DRIVEN ROTATION DEVICE

(71) Applicant: Lester D. White, Ashburn, VA (US)

(72) Inventor: Lester D. White, Ashburn, VA (US)

( * ) Notice: Subject to any disclaimer, the term of this patent is extended or adjusted under 35 U.S.C. 154(b) by 0 days.

(21) Appl. No.: 14/061,609

(22) Filed: Oct. 23, 2013

(51) Int. Cl.
*G01R 19/00* (2006.01)
*H01S 3/09* (2006.01)

(52) U.S. Cl.
USPC ........................................ 324/76.11

(58) Field of Classification Search
CPC ....................................... G01R 19/00
USPC ....................................... 324/76.11
See application file for complete search history.

(56) References Cited

U.S. PATENT DOCUMENTS

| | | | |
|---|---|---|---|
| 182,172 | A | 9/1876 | Crookes |
| 3,531,210 | A | 9/1970 | Shahrokhi et al. |
| 4,397,150 | A | 8/1983 | Paller |
| 4,410,805 | A | 10/1983 | Berley |
| 4,926,037 | A | 5/1990 | Martin-Lopez |
| 7,844,321 | B2 | 11/2010 | Milner et al. |
| 8,125,212 | B1 * | 2/2012 | White ........................ 324/76.11 |
| 2012/0138749 | A1 | 6/2012 | Ellinghaus |

OTHER PUBLICATIONS

Xiao-Feng Lin, Guo-Qing Hu,Qi-Dai Chen,Li-Gang Niu,Qi-Song Li et al, "A light-driven turbine-like micro-rotor and study on its light-to-mechanical power conversion efficiency" Department of Electrical and Computer Engineering, Appl. Phys. Lett.101, 113901 (2012).
Arita,Y, Mazilu, M & Dholakia, K 2013, "Laser-induced rotation and cooling of a trapped microgyroscope in vacuum" Nature Communications, vol. 4 , 2374, (Aug. 28, 2013).

* cited by examiner

Primary Examiner — Arleen M Vazquez
Assistant Examiner — Alesa Allgood
(74) Attorney, Agent, or Firm — Richard C. Litman

(57) ABSTRACT

The electromagnetic wave driven rotation device provides instrumentation for cataloging environmental anomalies that may occur along the circumferential path of a rotating electromagnetic (EM) wave beam having sufficient RPM that the instantaneous change in radial direction of the beam approaches light speed. Under those conditions, it is hypothesized that environmental anomalies, such as energy spikes, which ultimately can be harnessed as an energy source, may occur along or proximate to the circumferential beam path. Sensors may be disposed along the circumferential path of the rotating beam. Sensor data providing energy readings may be recorded in real time. Any sensor data collected may be analyzed in real time, and also post-processed. Since the wavefront energy is known along the circumference, any energy spikes recorded may be attributed to mass-like sub-measurable elements of space that may have come in contact with the mass-like components of the high speed rotating electromagnetic wave.

12 Claims, 9 Drawing Sheets

ELECTROMAGNETIC WAVE DRIVEN ROTATION DEVICE

BACKGROUND OF THE INVENTION

1. Field of the Invention

The present invention relates to instrumentation devices, and particularly to an electromagnetic wave driven rotation device for observation of the surrounding environment during high-speed rotation of electromagnetic waves.

2. Description of the Related Art

Over the last 350 years, a host of mathematicians and theoretical physicists have endeavored to define the nature of space, time and matter.

While researching this past work, the inventor noted that the basis of generally accepted concepts regarding space, time, and matter have changed dramatically as one thought process gave way to the next. Sir Isaac Newton's view of absolute space transitioned to Einstein's relativistic space, which, in part, had to be expanded to include Bohr's Quantum Mechanics. Throughout this 350-year period, true giants in the various fields of physics formed diametrically opposed opinions about the nature of the Universe and the interrelations between energy, mass, and "other" components that make it up. This has led to intellectual challenges, debates, and in some cases, open hostilities that occasionally divided the physics community into competing, if not warring, camps. Such contention in the past has resulted in both wholesale changes and significant refinements to accepted theories, but those conflicts have also consumed large amounts of intellectual resources and spanned decades of time.

With the advent of Quantum Mechanics, the above conflict openly spilled over into the areas of wave particle duality, probabilistics and causality. In 1934 Fritz Zwicky first coined the expression and postulated the existence of "Dark Matter", which in turn, led to the concepts of "Dark Energy, "Dark Fluid" and a host of discoveries that extend from them by Zwicky and others. Since the theories and related calculations regarding these "substances" are important elements in cosmology and since some differences in opinion continue to exist within the recognized community of leading theoretical physicist, the reader is encouraged to consult material available on the Internet for reference. Such references, in the inventor's opinion, effectively illustrate the key elements and continuing debates that are an integral part of the processes that define physics at this time.

Present cosmological understanding relies on a significant amount of non-baryonic, cold "dark" matter to explain the large-scale structure of the universe. Moreover, the presence of observed gravitational anomalies as well as cosmic microwave background (CMB) radiation suggests that the aforementioned dark matter exists.

Computer simulations of dark matter particles along with galactic surveys that document Doppler shift observations led to the conclusion that the cold dark matter model of structure formation is consistent with these observations.

Based on these studies, the Lambda-CDM model was constructed and measures the cosmological parameters, including the fraction of the universe made up of baryons and dark matter. The Lambda-CDM model predicts that there exists a dark matter component of approximately 25%, a dark energy component of approximately 70%, and a visible, observable universe comprised of approximately 5% of the totality of the cosmos.

Moreover, the Late-time Integrated Sachs-Wolfe Effect is an effect in which it has been observed that accelerated cosmic expansion causes gravitational potential wells and hills to flatten as photons pass through them, producing cold spots and hot spots on the CMB aligned with vast supervoids and superclusters, thus signaling dark energy in a flat universe.

The fabric of space and time as conceptualized by Albert Einstein is the idea that space itself is a stretchable and compressible substance in the presence of matter and that gravitational force is merely the visible consequence of space-time fabric expansion and compression near matter, thus altering the path of objects traveling near other objects.

Dark fluid is another model for gravity which hypothesizes that the fabric of space acts much like a fluid. Thus space would flow, coagulate, compress, or expand, just like any other fluid. The effect of dark fluid is always present, but only becomes noticeable in the presence of structures of significant mass, such as galaxies and galactic clusters. Moreover, dark matter is postulated to be a special case of the equations of Dark Fluid. However, practitioners having ordinary skill in the art of cosmology have widely varying theories regarding the structure of dark matter. Those theories range from the concept that dark matter is just an illusionary effect of space bunching up on itself to the theory that dark matter is comprised of particles called WIMPs (weakly interacting massive particles). It is further theorized that WIMPS are their own antimatter partner particles, and that if two WIMPs were to make contact, they would obliterate one another.

On the other extreme, in places where there is relatively little matter, as in the voids between galactic superclusters, dark fluid predicts that space relaxes and starts stretching away from itself. Thus, dark fluid becomes a repulsive force, which is the same effect as dark energy.

Dark fluid goes beyond dark matter and dark energy because it predicts a continuous range of attractive and repulsive qualities under various matter density cases. Dark fluid has been useful in predicting other gravitational theories, such as inflation, quintessence, k-essence, f(R), Generalized Einstein-Aether f(K), MOND, TeVeS, BSTV, and the like, as special cases within it. While the attributes of dark matter particles are not fully understood, it is reasonable to concede that any element that exhibits gravitational forces has mass-like characteristics and can exhibit velocity.

Thus, an electromagnetic wave driven rotation device for investigating the aforementioned problems is desired.

SUMMARY OF THE INVENTION

The electromagnetic wave driven rotation device provides instrumentation for cataloguing environmental anomalies, which may occur along the circumferential path of a rotating electromagnetic (EM) wave beam having sufficient revolutions per minute (RPM) that the instantaneous change in radial direction of the beam approaches 300,000,000 meters/second. Under those conditions, it is hypothesized that environmental anomalies, such as agglomerated particles (White Particles) with associated energy spikes, may occur along the circumferential beam path.

Sensors may be disposed along the circumferential path of the rotating beam. Sensor data providing energy readings are recorded in real time. The sensor data is analyzed in real time, and also post-processed. Since the wavefront energy is known along the circumference, any energy spikes recorded proximate the wavefront may be attributed to mass-like sub-measurable elements of space that may have come in contact with the mass-like components of the high speed rotating electromagnetic wave. A facility may be provided to enclose the rotating apparatus and sensors.

It should be understood that the present electromagnetic wave driven rotation device does not represent any attempt to interject or express an opinion on scientific debates regarding dark matter, dark energy, dark fluids or any aspects thereof, but is offered to test some of the theories behind these debates. Rather, the present electromagnetic wave driven rotation device represents a practical device that explores and exploits the information, findings and majority opinions found in cosmological literature.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1A:
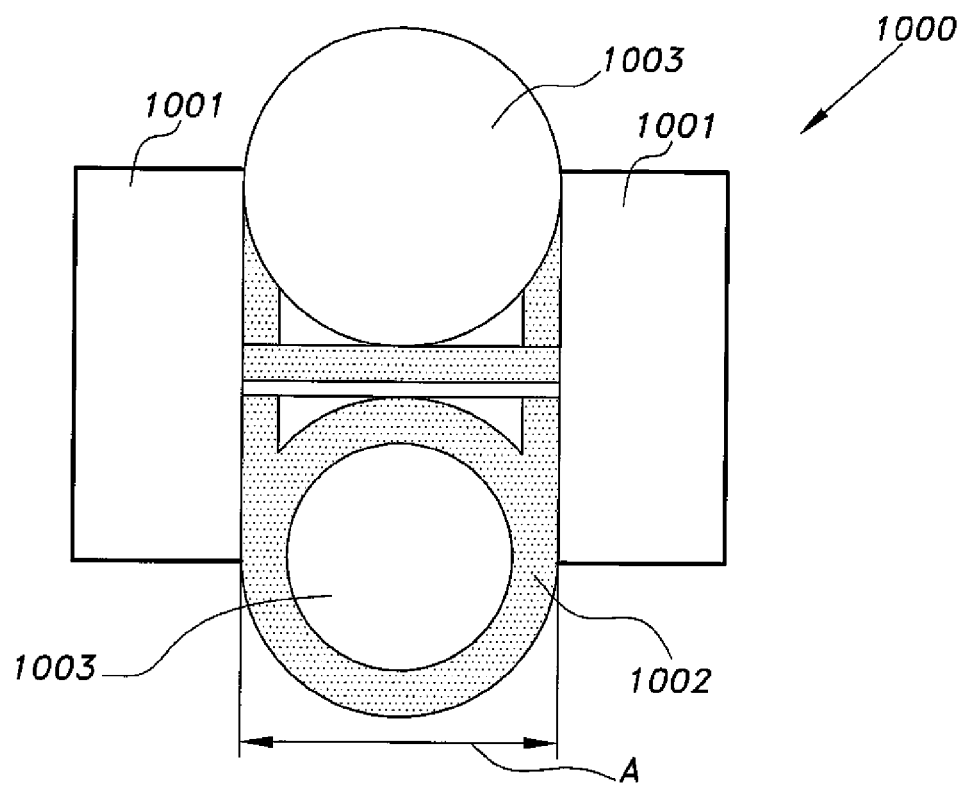
FIG. 1A is a front view of the rotor assembly of an electromagnetic wave driven rotation device according to the present invention.
Figure 1B:
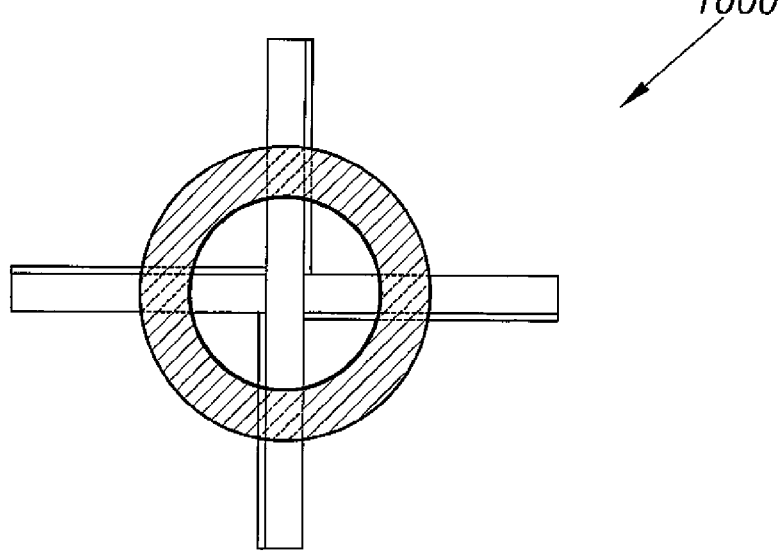
FIG. 1B is a side view of the rotor assembly of FIG. 1, partially in section.

As shown in FIGS. 1A, 1B, the electromagnetic wave driven rotation driver assembly 1000 is a prime mover that directs EM waves along a rotational arc, which is directed at instrumentation for detecting and cataloguing energetic environmental anomalies that may occur along or proximate the circumferential path of the rotating electromagnetic (EM) wave beam having sufficient revolutions per minute (RPM) that the instantaneous change in radial direction of the beam approaches 300,000,000 meters/second. Under those conditions, it is hypothesized that environmental anomalies, such as energy spikes, may occur along or proximate to the circumferential beam path. As was disclosed in U.S. Pat. No. 8,125,212, issued to White on Feb. 28, 2012, which is hereby incorporated by reference in its entirety, sensors may be disposed along the circumferential path of the rotating electromagnetic wave. Sensor data providing energy readings may be recorded in real time. The sensor data can be analyzed in real time and also post-processed. Since the wavefront energy is known along the circumference, any energy spikes recorded may be attributed to mass-like, sub-measurable elements of space that may have come in contact with the mass-like components of the high speed rotating electromagnetic wave. It is expected that these energy spikes ultimately can be harnessed as an energy source. A temperature-controlled vacuum shell and full system containment facility may be provided to enclose the electromagnetic wave driven rotation driver assembly 1000 and sensors, although operation of the electromagnetic wave driven rotation device does not require a surrounding building.

As most clearly shown in FIGS. 1A, 1B, 2A and 2B, the electromagnetic wave driven rotation device includes a turbine-like rotary driver assembly 1000, which is powered by high energy laser, maser, or microwave EM fields directed by waveguides 200a, 200b for causing tensioned titanium (other similar materials may be used) foil photon targets 1003 attached to a drive shaft 1001 to rotate at an ultra-high rotational rate ($\omega$), which, in turn, rotates an EM beam that has been redirected from an outside source via the electromagnetic wave driven rotation device, designed for that purpose. Sensors for detecting environmental effects of the rotating EM beam may be disposed at a predetermined radial distance from the source of the rotating EM beam. As was disclosed in U.S. Pat. No. 8,125,212, the detection means includes a plurality of sensors spaced at intervals along a circumference defined by the predetermined radial distance from the rotating beam source (electromagnetic wave driven rotation device in the present disclosure). Moreover, sensors may be arranged both inside and outside of the rotational unit's vacuum enclosure system at various distances from the axial center of rotation. Preferably, the sensors are particle/energy detectors. Particle/energy detectors are known to persons having ordinary skill in the art, and may include, but not be limited to, ionization counters, Geiger counters, Cerenkov counters, scintillating counters, and the like. It is expected that environmental perturbations in energy can be detected by arrays of the sensors disposed at predetermined radial distances from the electromagnetic wave driven rotation device.

Rotary driver assembly 1000 includes a magnetic bearing compatible drive shaft 1001, which includes an integrated one-piece core constructed of titanium or similar material, and an integrated one-piece-target unit support frame 1002 having a width A that is determined as the minimal size required for the EM power Wave to maintain contact with the foil photon targets 1003 supported on the frame 1002. A side view of the turbine-like driver assembly 1000 is shown in FIG. 1B.

Figure 2A:
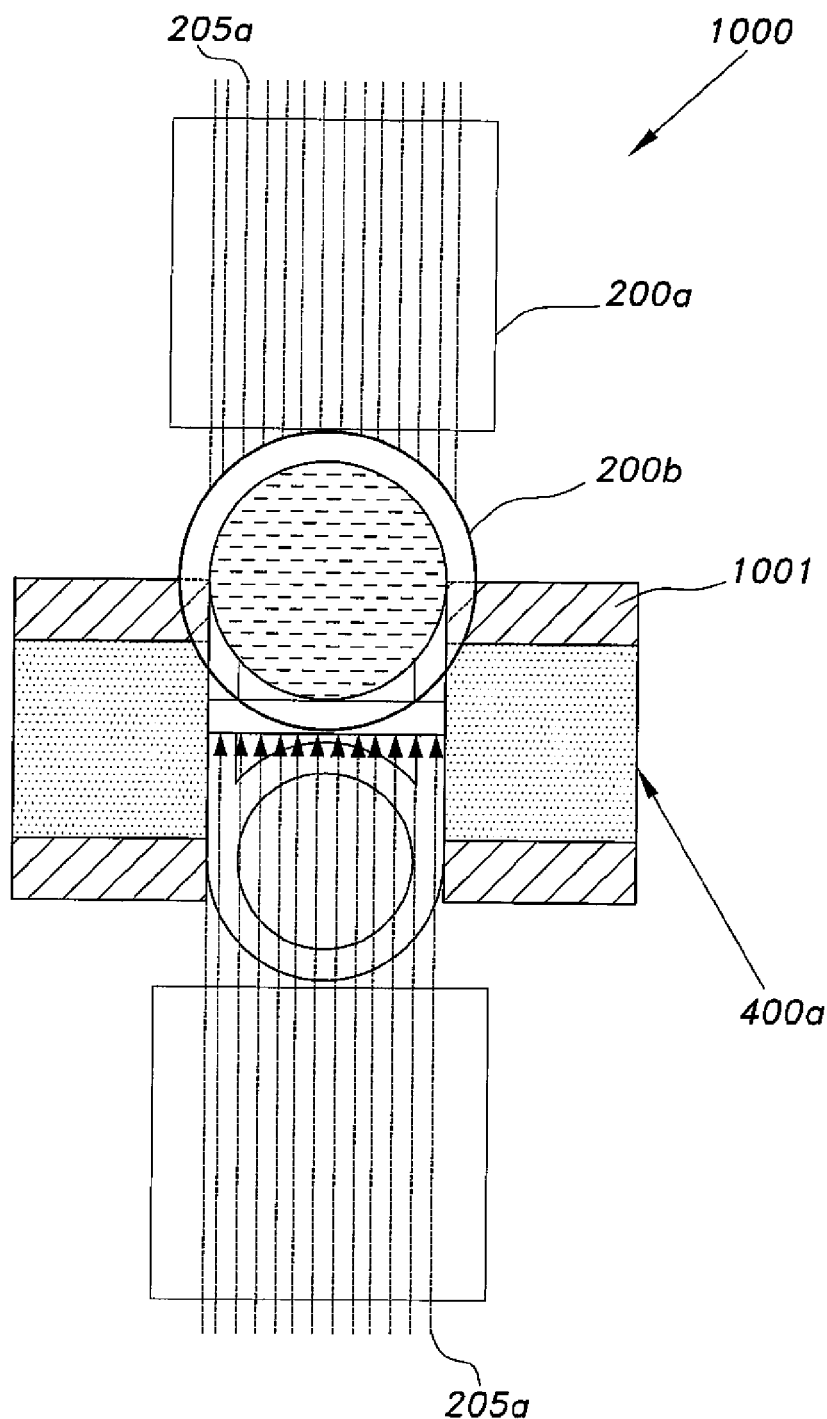
FIG. 2A is a front view of the waveguide assembly of the electromagnetic wave driven rotation device according to the present invention.
Figure 2B:
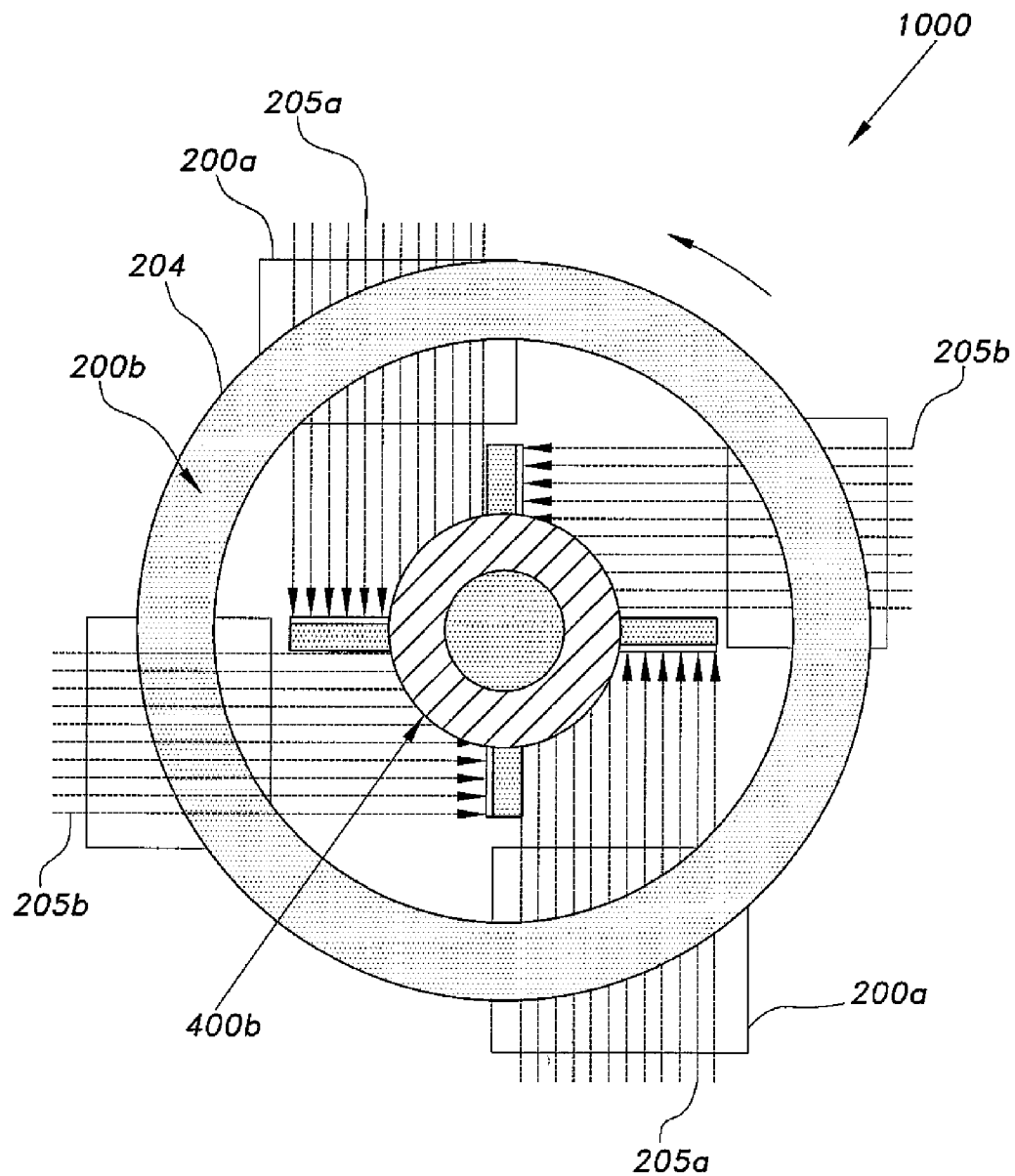
FIG. 2B is a side view of the waveguide assembly of FIG. 2A.

As most clearly shown in FIGS. 2A and 2B, operation of the turbine-like driver assembly 1000 includes directed EM power wave inputs 205a and orthogonally related EM wave inputs 205b impinging on the targets 1003 to turn the magnetic bearing compatible drive shaft 1001. The rotational assembly of targets 1003, drive shaft 1001 and magnetic bearings 400a, 400b are disposed inside a temperature-controlled vacuum chamber wall 204.

The waveguides 200a, 200b are disposed inside a cylindrical structured vacuum chamber wall 204 having flat outer sides. The rotating turbine vane shaped targets 1003 are disposed on magnetic bearing compatible shaft 1001. As shown in FIG. 211, rotation of the turbine-like driver assembly 1000 is illustrated as being counterclockwise, but may also be clockwise without affecting the function of the unit. There are four EM power wave input ports disposed along the cylindrical structured vacuum chamber defined by vacuum chamber wall 204 and align with their corresponding waveguides positioned inside of the vacuum chamber.

The electromagnetic wave driven rotation device is suspended by levitation within high speed magnetic bearing assembly 400 that allows the high speed rotary driving force of the EM wave to impart high speed rotary motion to the targets 1003 with near zero friction losses. The magnetic bearing compatible composite shaft 1001 is an integral part of the turbine driver assembly, and its outer diameter is set such that the center of the turbine vanes aligns with the outer circumference of the driver shaft.

Figure 8:
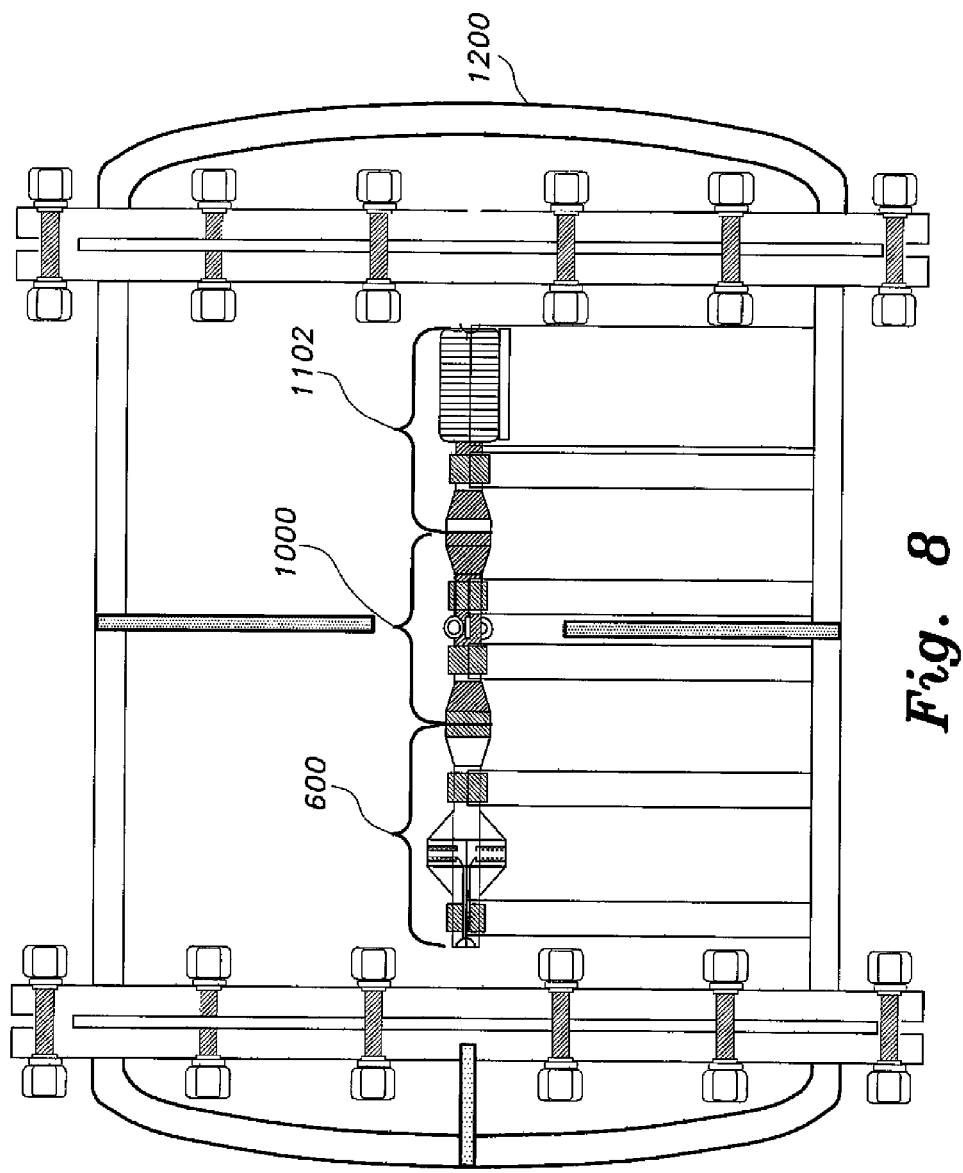
FIG. 8 is a side view showing the entire assembly according to the present invention, including the temperature-controlled full vacuum outer shell.

In the present device, photon pressure is the motive force and the primary resistance force is friction. Resistance to motion caused by bearing friction is minimized through the use of the levitating magnetic bearings with a compatible driver shaft 1001, which is suspended by magnetic bearings 400. Likewise environmental friction has been minimized by establishing operations in a temperature-controlled full vacuum maintenance system. The electromagnetic wave driven rotation device includes four component assemblies plus their associated instrumentation, controls and operational support infrastructure. These four key components, as depicted in FIG. 8, are: (1) The Unit's Photon Powered Driver Assembly 1000, (2) The Unit's Rotating Electromagnetic (EM) Wave System Assembly 600, 3) The Unit's slow-roll starter motor 1102 and 4) The Unit's Temperature-Controlled Full Vacuum Outer Shell 1200.

With respect to the driver assembly, the ultrahigh speed rotation produced by this system is the result of sustained momentum transfer between power wave driver photons and the associated rotating targets 1003. The targets are tension-mounted thin film-structures supported by the one piece titanium, or similar material, frame 1002 and an associated integral shaft 1001, equipped with four of the rotating paddle-shaped targets 1003 disposed on the shaft 1001. The shaft 1001 of the rotational system is levitated and constrained to its rotation axis by the magnetic bearings 400a, 400b, and is operated in a temperature-controlled full vacuum environment. The tensioned-foil photon targets 1003 have a circular cross section and are approximately 0.005 mm thick, and have an outer diameter that is set by the cross-sectional project of the power EM wave on the targets (typically on the order of 2.5 mm).

Figure 3:
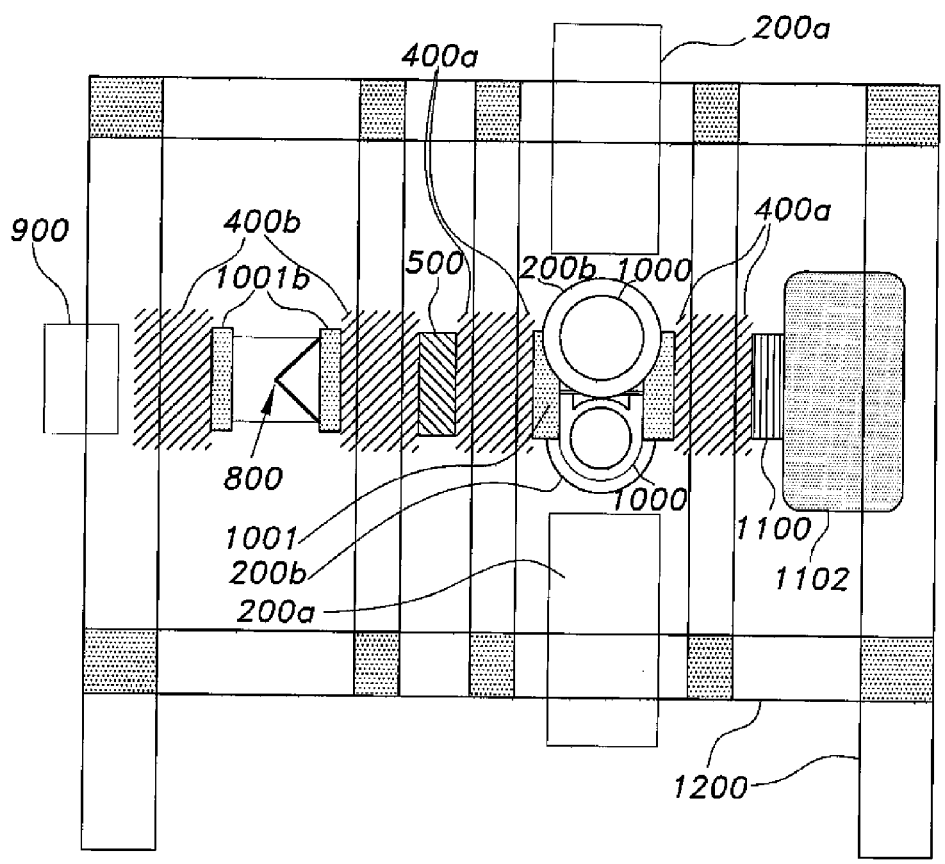
FIG. 3 is a diagrammatic side view of an electromagnetic wave driven rotation device according to the present invention.

As shown in FIG. 3 and FIG. 8, the rotational system is also equipped with a starter motor 1102 and quick disconnect coupling assembly 1100. Starter motor 1102 is used to both overcome the rotating assembly at rest inertia and to establish initial rotation (on the order of 100,000 RPM) in order to dynamically test system balance and stability before engaging the photon drive power.

Referring again to FIG. 3, the components in alignment about the rotational axis of the device include the photon driver turbine driver assembly 1000, a plurality (four are shown) of photon motive force waveguides 200a, 200b and associated photon motive force lasers, rotating composite shaft type A 1001 and its associated magnetic bearing assembly 400a, high speed coupling 500, magnetic bearing assembly B 400b for levitating rotating composite shaft type B 1001b. The type B shaft 1001b supports the unit's rotating wave splitter and exemplary 45° redirect system assembly 800. The rotating laser input waveguide 900 allows high energy photons into the system. It should be understood that the rotational wave component 600 directs the energy from a fixed instrumentation EM source aimed at the EM wave focus lens 661 to rotate at a rate influenced by the EM power wave source(s) aimed at the targets of the photon powered driver assembly 1000.

Slow roll starter motor 1102 starts the rotating device before the high energy EM Power wave system is engaged. Once the high energy EM power waves take over propulsion of the rotating device, disengagement coupling 1100 disengages the slow roll starter motor 1102 from the rotating assembly.

The Unit's outer vacuum shell 1200 includes integrated internal wave guides, thermal regulating systems and physical supports.

Figure 5A:
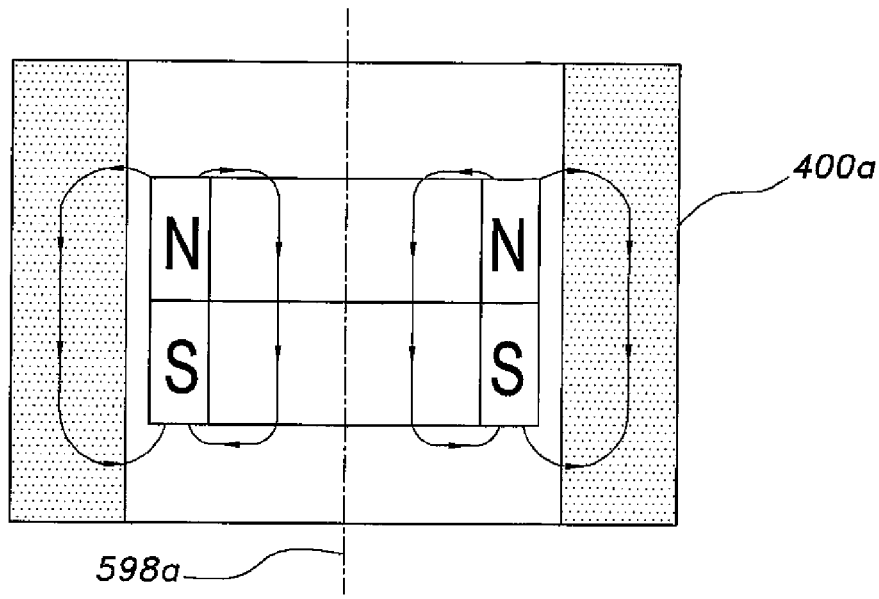
FIG. 5A is a diagrammatic front view of an exemplary electrodynamic bearing assembly of the prior art, shown with a magnetic shaft before displacement of the shaft.
Figure 5B:
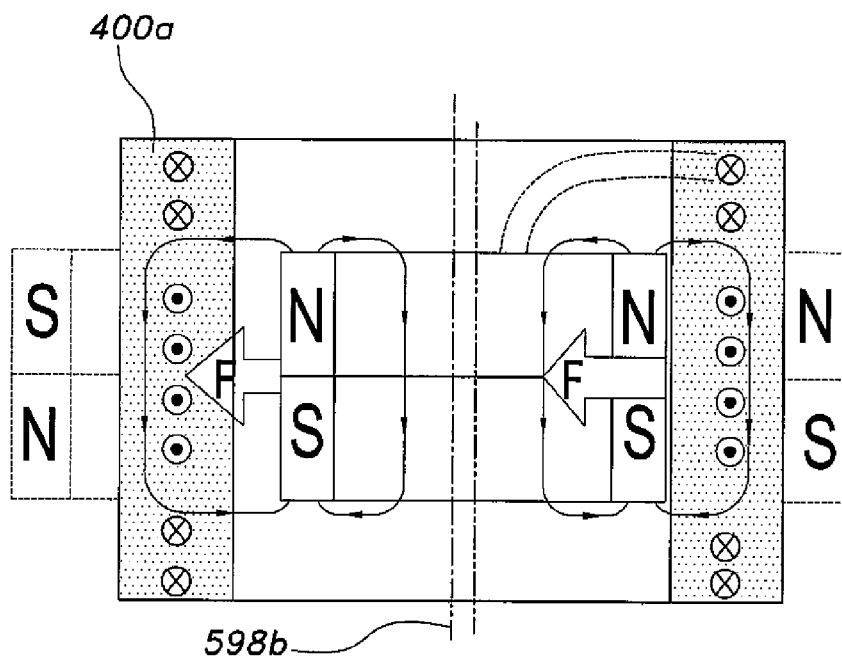
FIG. 5B is a diagrammatic front view of the electrodynamic bearing assembly of FIG. 5A after displacement of the shaft, illustrating the force needed to return the shaft to its original position.

The device includes instrumentation for the photon turbine system, instrumentation for the rotational laser, instrumentation for the operational environment, an operating unit temperature control system, an operating unit vacuum control system, photon power laser sources, a rotating laser beam source, and the slow roll power and decoupling systems. The electrodynamic bearing assembly 400a is known to those of ordinary skill in the art, and its operation is illustrated in FIGS. 5A and 5B, where in FIG. 5A no current flow allows a moveable central axial portion to remain in an undisplaced position 598a, and in FIG. 5B, current flow creates a force that displaces the central axial portion to a displaced position 598b. The electrodynamic bearing assembly 400 (shown in FIGS. 3 as 400a and 400b) suspends the shaft in position aligned with the axial center of the electrodynamic bearing assembly 400. (Axial displacement is shown in the drawings. However, the bearing assembly 400 also corrects for radial displacement.)

The photon driver power supply system is adapted directly for use from one of the many commercially available Electromagnetic Wave (EM) generators. Examples of similar photon driver supply systems include: laser, masers, and standard light generators. For the example presented with this submission, four identical lasers (with the same wavelength and power levels) are used to supply driver photons.

The rotating electromagnetic (EM) wave supply system as shown is adapted directly for use from one of the commercially available Electromagnetic Wave (EM) laser generators. Examples of these EM Wave sources include laser, masers, and standard light generators.

Figure 4A:
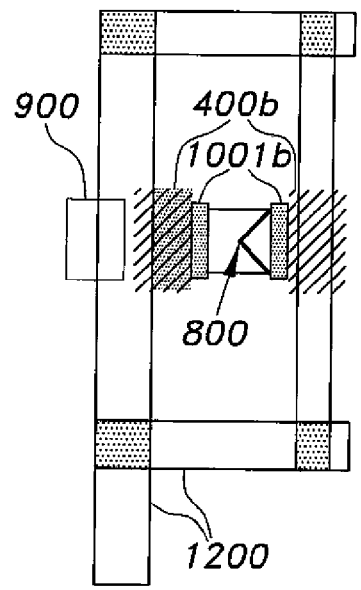
FIG. 4A is a diagrammatic side view of the 45° electromagnetic wave splitter/diverter assembly of the electromagnetic wave driven rotation device according to the present invention.
Figure 4B:
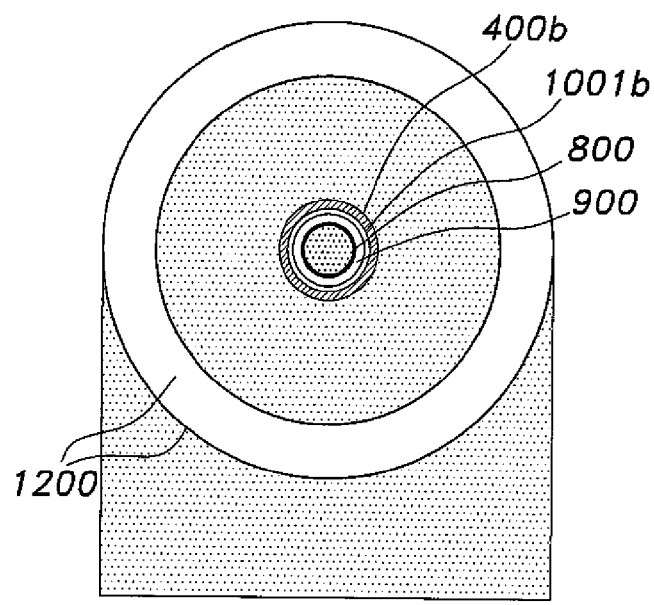
FIG. 4B is a diagrammatic end view of the 45° electromagnetic wave splitter/diverter assembly of FIG. 4A.

Referring to detail plan view shown in FIG. 4A and side view shown in FIG. 4B, the rotating electromagnetic (EM) wave splitter/diverter (RID) system 800 includes the inboard shaft assembly B 1001b for the Rotating EM Wave RID system, which is supported by magnetic bearing assembly B 400b and is coupled directly to the rotating drive assembly of the unit via a fixed (magnetically levitated) coupling. The center section of the rotating EM wave RID systems assembly includes an EM wave splitter and wave guide-based diverter that is encapsulated in an ultra-high purity silica (or similar wave guide material) cylinder and dynamically balanced by the unit's magnetic bearing system to maintain operational stability. The outboard shaft assembly for this unit is also supported by magnetic bearings 400 in a ring-like configuration. The externally positioned waveguide 900 directs the EM Wave beam to be rotated to the splitter/diverter assembly 800.

The core of the outboard Rotating EM Wave unit is openly visible through the center of the outboard support shaft bearing. This opening is referred to as "the shaft EM wave input window". The rotational EM Wave leaves the EM Wave generator and passes through an internal wave guide in the Full Vacuum/Temperature Controlled enclosure that routes it to a polarizing/focus input lens at the entry port of the rotating EM Wave processing assembly. After passing through the input window lens, the EM Wave continues on to the rotating wave splitter/diverter 800 encapsulated in the ultra-high purity silica shaft core, which subsequently directs the split input wave into two identical straight line paths that form the extended plane of rotation for the unit.

Unit Temperature-Controlled Full Vacuum Outer Shell: All unit rotating components are mounted in a temperature controller full vacuum container. The container is equipped with EM wave guides for both the photon power waves and the rotating EM Wave. Any and all access points to the inner portion of the shell are fully sealed for high vacuum operation.

Regarding instruments, controls and data collection equipment, each of the above assemblies are individually equipped with standard commercial instrumentation, operational controls and data collection systems. Each instrumentation system is an integral subset of the assemblies it supports. All such support systems are mounted outside of the Unit's Temperature Controlled Full Vacuum Outer Shell.

Figure 6:
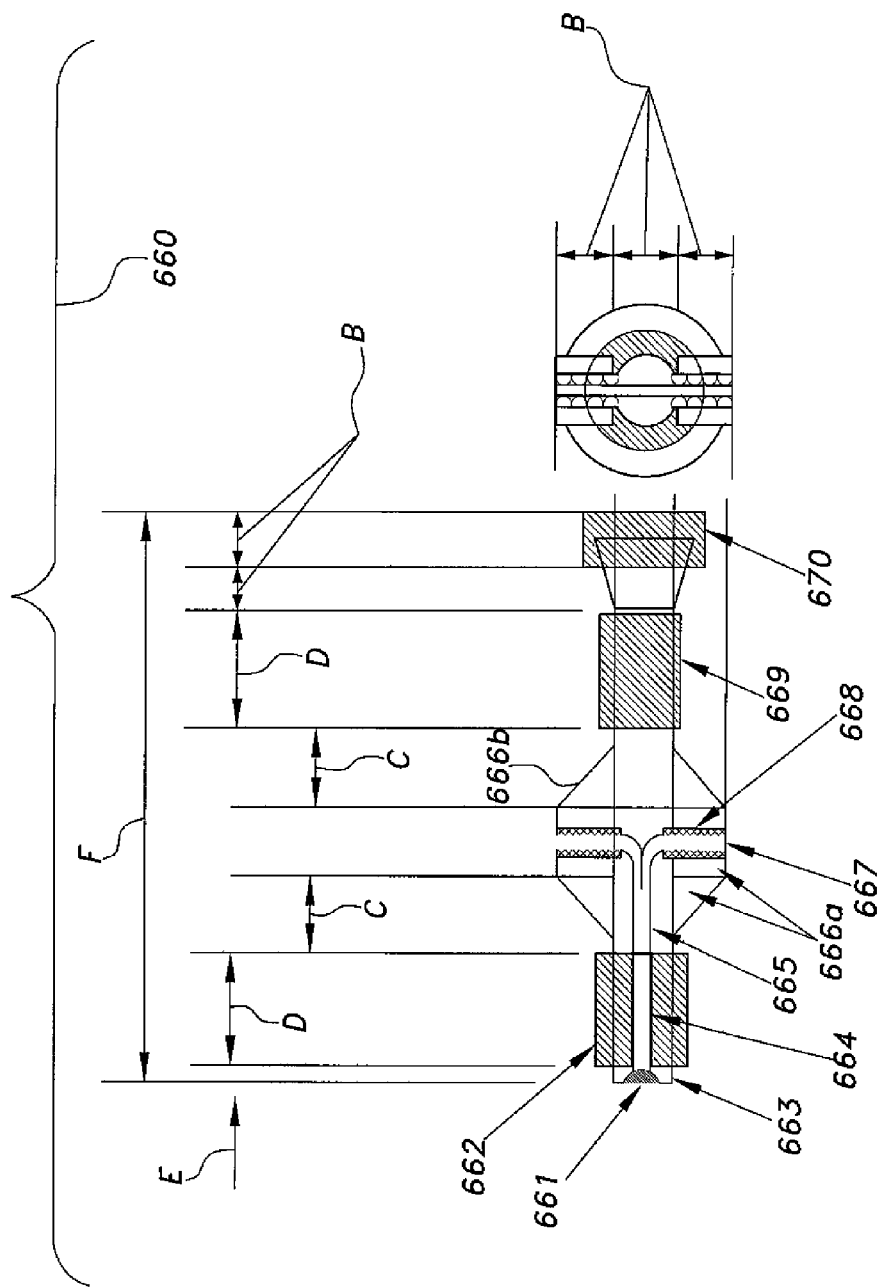
FIG. 6 is a partial side view of the electromagnetic wave driven rotation device according to the present invention, showing details of the rotating element of the wave splitter/diverter assembly.
Figure 7:
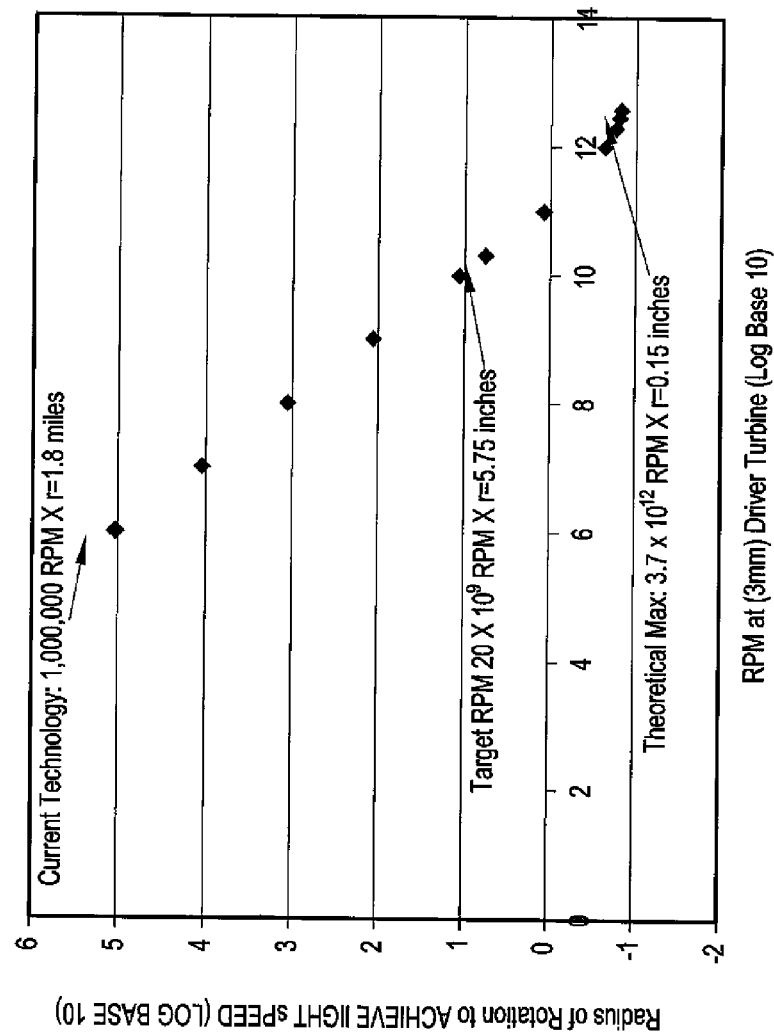
FIG. 7 is a plot showing potential rotational speed of the electromagnetic wave driven rotation device according to the present invention.

Referring to FIG. 6, in a detail of an embodiment 660 of the electromagnetic wave driven rotation device, an EM wave focus/polarizing lens 661 is included and is disposed in alignment with the device's axis of rotation in a support recess having an approximate dimension E, based on lens requirements. For the system shown in this submission, that recess is approximately 0.125 inches, the support recess; presented in this submission being formed by a high purity Silicon waveguide 663. An outboard magnetic bearing 662 surrounds an internal waveguide channel 664 created by the waveguide 663. The outboard magnetic bearing 662 has a length dimension D of approximately 0.500 inches. Downstream from the outboard magnetic bearing 662 is a 50/50 wave splitter 665. Silicon support structures 666a extend outward and downstream from the wave splitter 665 for a length C of approximately 0.625 inches for the unit illustrated. A complementary support structure 666b extends from the opposite direction for the same length C outward and upstream from an inboard magnetic bearing 669 to create a gap within which a waveguide channel 667 is disposed after the splitter. Inboard magnetic bearing 669 also has length D.-Circular polarization systems for the rotating EM Waves 668 are disposed within the wave guide and downstream of the rotational wave splitter, waveguide channel 667. A rotator-to-driver magnetic coupling 670 is operably connected to the most distal (downstream) end of the inboard magnetic bearing 669. The rotator-to-driver magnetic coupling 670 has a length B of approximately 0.250 inches. A frustoconical portion of the driveshaft is partially embedded in the coupling 670. An exposed portion of the frustoconical driveshaft structure extends the same length B away from the coupling 670. Over-all length F of the device from rotator-to-driver magnetic coupling 670 to proximal end of waveguide 663 is approximately 3.875 inches. The device 660 has a circular cross-section that extends dimension B from outer portion of the first target to inner portion of the first target, dimension B from inner portion of the first target to inner portion of the second target, and dimension B from inner portion of the second target to outer portion of the second target. Plot 760 of FIG. 7 displays a theoretical maximum achievable RPM of the present electromagnetic wave driven rotation device.

It is to be understood that the present invention is not limited to the embodiments described above, but encompasses any and all embodiments within the scope of the following claims.

I claim:

1. An electromagnetic (EM) wave driven rotation device, comprising:

an EM wave lens adapted for processing EM waves emitted from a fixed position instrumentation EM wave source;

a high purity silicon waveguide surrounding the EM wave lens, the waveguide having a recess portion, the EM wave lens being disposed in the recess portion of the high purity silicon waveguide;

an internal waveguide channel defined by the high purity silicon waveguide;

an outboard magnetic bearing surrounding the internal waveguide channel;

a 50/50 wave splitter/diverter disposed downstream from the outboard magnetic bearing;

an inboard magnetic bearing;

silicon support structures extending outward and downstream from the 50/50 wave splitter, and outward and upstream from the inboard magnetic bearing;

a post-splitter waveguide channel formed by a gap in the silicon support structures;

discharge ring polarizers disposed within the post-splitter waveguide channel, the discharge ring polarizers being retained by the silicon support structures;

a rotator drive shaft defining the rotation axis of the electromagnetic wave driven rotation device, spin of the rotator drive shaft being constrained to the rotation axis by the magnetic bearings, the EM wave lens being disposed in alignment with the axis of rotation;

a plurality of EM wave target paddles disposed on the rotator drive shaft;

at least one power EM wave source traveling through the waveguide and targeting the target paddles to cause rotation of the rotator drive shaft, the at least one EM power wave source, target paddles and rotator drive shaft forming an ultra-high revolutions per minute (RPM) driver for causing rotation of the electromagnetic wave driven rotation device; and a rotator-to-driver magnetic coupling operably connected to the most distal (downstream) end of the inboard magnetic bearing, the rotator-to-driver magnetic coupling transferring torque to the rotator drive shaft.

2. The electromagnetic wave driven rotation device according to claim 1, further comprising a plurality of sensors spaced at intervals along a circumference defined by a predetermined radial distance from an origin of a rotational track of an EM beam emitted by the electromagnetic wave driven rotation device, the sensors having means for recording energy spikes proximate the predetermined radial distance.

3. The electromagnetic wave driven rotation device according to claim 1, further comprising a slow roll starter motor operably connected to the ultra-high revolutions per minute (RPM) driver.

4. The electromagnetic wave driven rotation device according to claim 3, further comprising a disengagement coupling interoperable with the slow roll starter motor and the ultra-high revolutions per minute (RPM) driver.

5. The electromagnetic wave driven rotation device according to claim 4, wherein the 50/50 wave splitter further comprises an EM wave guide diverter encapsulated in an ultra-high purity silica wave guide cylinder, the EM wave splitter/diverter assembly being dynamically balanced to maintain operational stability by the magnetic bearings, the magnetic bearings dynamically supporting the rotating shaft.

6. The electromagnetic wave driven rotation device according to claim 5, wherein a core of an outboard Rotating EM Wave portion of the electromagnetic wave driven rotation device is openly visible through a center of an outboard bearing supporting the drive shaft.

7. The electromagnetic wave driven rotation device according to claim 6, further comprising a vacuum chamber, the ultra-high revolutions per minute (RPM) driver being disposed inside the vacuum chamber.

8. The electromagnetic wave driven rotation device according to claim 7, further comprising a temperature controller and associated thermal system regulating temperature of said vacuum chamber.

9. The electromagnetic wave driven rotation device according to claim 8, wherein said at least one EM wave source is a coherent microwave transmitter.

10. The electromagnetic wave driven rotation device according to claim 8, wherein the ring polarizers comprise rare earth magnetic material.

11. The electromagnetic wave driven rotation device according to claim 8, wherein said at least one EM wave source is a laser.

12. The electromagnetic wave driven rotation device according to claim 11, wherein said at least one EM wave source comprises four identical lasers having the same wavelength and power levels.

* * * * *